United States Patent [19]
Zdanys, Jr. et al.

[11] Patent Number: 5,684,407
[45] Date of Patent: Nov. 4, 1997

[54] ELECTRONIC CIRCUIT PACKAGED WITH A POSITION SENSOR

[75] Inventors: John Zdanys, Jr.; James N. Hufford, both of Elkhart, Ind.; Robert F. Gornick, Edwardsburg, Mich.

[73] Assignee: CTS Corporation, Elkhart, Ind.

[21] Appl. No.: 157,974

[22] Filed: Nov. 24, 1993

Related U.S. Application Data

[63] Continuation of Ser. No. 647,136, Jan. 29, 1991, abandoned.

[51] Int. Cl.$^6$ ............................................. H03F 1/26
[52] U.S. Cl. .................. 324/714; 324/723; 324/611; 73/118.2; 340/870.38; 338/50; 338/184
[58] Field of Search ........................ 324/713, 611, 324/715, 714, 722, 723; 340/870.37, 870.38; 73/118.1, 118.2; 338/50, 184, 199, 226

[56] References Cited

U.S. PATENT DOCUMENTS

| | | | |
|---|---|---|---|
| 2,888,633 | 5/1959 | Carter | 323/9 |
| 2,893,134 | 7/1959 | Shea et al. | 33/206 |
| 2,951,211 | 8/1960 | Brashear | 332/9 |
| 2,999,965 | 9/1961 | Airey | 318/28 |
| 3,192,405 | 6/1965 | Patchell | 307/88.5 |
| 3,321,754 | 5/1967 | Grimm et al. | 324/429 |
| 3,519,839 | 7/1970 | Nehez | 307/35 |
| 3,654,545 | 4/1972 | Demark | 323/75 |
| 3,805,150 | 4/1974 | Abbe | 324/61 |
| 3,810,008 | 5/1974 | Motoda et al. | 324/714 |
| 3,812,712 | 5/1974 | Hoffman | 340/870.38 |
| 4,198,934 | 4/1980 | Carp et al. | 123/32 |
| 4,280,465 | 7/1981 | Staerzl | 123/494 |
| 4,296,413 | 10/1981 | Milkovic | 340/870.38 |
| 4,355,293 | 10/1982 | Driscoll | 338/184 |
| 4,387,438 | 6/1983 | Lucich et al. | 364/574 |
| 4,519,664 | 5/1985 | Tillotson | 339/143 |
| 4,678,260 | 7/1987 | Gallusser et al. | 439/607 |
| 4,715,220 | 12/1987 | Eitoku et al. | 73/118.1 |
| 4,716,359 | 12/1987 | Numata et al. | 323/349 |
| 4,795,660 | 1/1989 | Cooray et al. | 427/123 |
| 4,893,502 | 1/1990 | Kubota et al. | 73/118.1 |
| 4,894,638 | 1/1990 | Flierl et al. | 338/162 |
| 4,901,561 | 2/1990 | Glowczewski | 73/118.1 |
| 4,915,075 | 4/1990 | Brown | 123/399 |
| 4,920,939 | 5/1990 | Gale | 324/549 |
| 4,972,816 | 11/1990 | Mausner | 123/399 |
| 4,992,734 | 2/1991 | Adachi | 324/207.25 |
| 5,079,500 | 1/1992 | Oswald | 324/714 |
| 5,111,201 | 5/1992 | Matsumura | 340/870.38 |
| 5,138,873 | 8/1992 | Amano | 73/118.1 |
| 5,165,272 | 11/1992 | Kleinhans et al. | 73/118.1 |
| 5,289,134 | 2/1994 | Kohr | 324/714 |
| 5,450,930 | 9/1995 | Martens et al. | 324/207.2 |

FOREIGN PATENT DOCUMENTS

| | | | |
|---|---|---|---|
| 0163049 | 3/1985 | European Pat. Off. | H01R 13/658 |
| 2927295 | 1/1981 | Germany | F02P 9/00 |
| 3640110 | 7/1987 | Germany | G01B 7/30 |
| 4020105 | 6/1990 | Germany . | |
| 1169902 | 5/1989 | Japan | H01C 10/32 |
| 1435124 | 5/1976 | United Kingdom | G08C 15/08 |
| 2191632 | 12/1987 | United Kingdom | H01L 23/28 |

*Primary Examiner*—Vinh P. Nguyen
*Assistant Examiner*—Jose M. Solis
*Attorney, Agent, or Firm*—Albert W. Watkins; Michael W. Starkweather

[57] ABSTRACT

A voltage follower is incorporated within a molded electrical connector interface of a position sensor in a way that does not detract from the dimensions or the performance of the finished sensor. The incorporation of the voltage follower into the housing of the variable resistor provides several advantages over the prior art, including: an immunity to sag; substantially reduced sensitivity to noisy contactors; and short lead length and low output impedance, both of which result in reduced interference from external source.

14 Claims, 2 Drawing Sheets

ELECTRONIC CIRCUIT PACKAGED WITH A POSITION SENSOR

This is a continuation of application Ser. No. 07/647,136, filed Jan. 29, 1991, now abandoned.

BACKGROUND OF THE INVENTION

1. Field of the Invention

This invention pertains to mechanically variable resistors generally, and particularly to position sensors having an electronic circuit in combination therewith.

2. Description of the Related Art

Mechanically variable position sensors generally use a three terminal potentiometer, either of the linear or rotary type. Illustrative of these sensors are U.S. Pat. Nos. 4,355,293, 4,715,220, and 4,894,638. Two of the terminals electrically connect the first termination of a resistor to an opposite termination. Somewhere between these two extremes a contactor travels, contacting the resistor and effectively dividing the resistor into two segments. The resistor similarly divides a voltage impressed across the terminations so that the voltage derived at the contactor represents the position of the contactor between the two terminations.

For example, should the contactor be physically positioned exactly one half the distance between the two terminations, the voltage impressed upon the contactor will be one half the total voltage impressed across the terminations. Once the voltage across the terminations is known, the calculation of the position of the contactor should be a simple matter.

Unfortunately, the world is not always a simple place. To measure the voltage across the contactor, some type of voltage sensor is used as illustrated schematically in prior art FIG. 1. Terminals 1 and 3 of R are connected across some supply voltage V+. Terminal 2, the contactor, is positioned somewhere between terminals 1 and 3. Vsense represents the voltage sensor used in the present example. As is known, to sense the voltage between terminals 2 and 3 some finite amount of current must flow through the sensor via the contactor (terminal 2). This flow of current translates into some finite load resistance placed in parallel with one or the other of the two segments of the variable resistor. The equivalent circuit shown in FIG. 2 illustrates this, wherein R1 represents the resistance from terminal 1 to terminal 2, R2 represents the resistance from terminal 2 to terminal 3, and Rload represents the resistance of the voltage sensor Vsense. Since the load resistance Rload is in parallel with one segment (R2) of the variable resistor, the effective resistance of the paralleled segment (R2-Rload) is reduced. This effectively reduces the output voltage measured across the contactor, as is illustrated in prior art FIG. 3. In prior art FIG. 3, the voltage sensed by Vsense is plotted against the relative position of the contactor between terminals 1 and 3, represented mathematically by R1/(R1+R2). The three plots labelled A, B, and C represent various values for Rload. Plot A represents a relation whereby Rload>>R. This plot A is for practical purposes as linear as may be possible depending upon the original qualities of R. Plot B represents a relation whereby Rload>R. Notice that although the starting and ending values are the same, the plot is no longer a straight line, but has begun to take on a curved appearance. Plot C represents a relation whereby Rload is approximately equal to R. The phenomenon illustrated in FIG. 3 is commonly referred to as sag, because as the load resistance approaches the original resistance R, the plot appears to sag.

A phenomenon called contact resistance causes a second problem. Because the contactor, terminal 2, mechanically slides across one surface of R, there is not an ideal electrical connection between the contactor and resistor R. Equivalent circuit 4 schematically illustrates this. Circuit 4 is similar to prior art FIG. 2, except that Rcontact now represents the resistance present between contactor terminal 2 and resistor R. When Rcontact remains small relative to Rload, the sensed voltage Vsense remains relatively linear as the contactor slides between terminals 1 and 3. However, those skilled in the art have been aware for many years that as the variable resistor is exposed to the environment and to repeated cycling, Rcontact will increase and begin to vary in an apparently random and dynamic manner. Plot B in FIG. 5 illustrates an aged contactor, wherein each occurrence of Rcontact becoming significant relative to Rload results in a drop in Vsense. Artisans often describe this condition as "having a noisy control," or "the contactor being noisy." Many methods are proposed in the prior art to overcome this problem. Typically, these methods have included alterations in the chemical composition of either the contactor or the resistor R. Occasionally, various additives have been "sprinkled on" to the variable resistor or special coatings applied. Sometimes, the surface topography has been altered in an attempt to smooth the path the contactor must traverse. However, each of these methods has met with only limited success. As modern original equipment manufacturers strive for higher reliability, the position sensor industry has reached somewhat of a plateau in the further refinement of previously known methods for improving the reliability of contactor type mechanically variable position sensors.

SUMMARY OF THE INVENTION

The present invention seeks to overcome the limitations of the prior art by incorporating within a single package a sensor, such as a mechanically variable potentiometer, and a voltage follower circuit. The incorporation of the voltage follower into the housing of the sensor provides several advantages over the prior art, including: an immunity to sag; substantially reduced sensitivity to noisy contactors; and short lead length and low output impedance, both of which result in reduced interference from external sources.

A sensor for generating an output electrical signal representative of a condition comprising: a sensing means for producing a first electrical signal representative of a first measured condition; an electrical circuit means having as a first input said first electrical signal and generating a second electrical signal; and an enveloping means for surrounding said electrical circuit means and said sensing means, said electrical circuit and said sensing means being relatively proximal within said enveloping means and thereby relatively jointly isolated from adverse effects of an environment external of said sensor, said enveloping means having dimension substantially similar to corresponding dimensions of said sensing means.

DESCRIPTION OF THE PREFERRED EMBODIMENT

Figure 6:
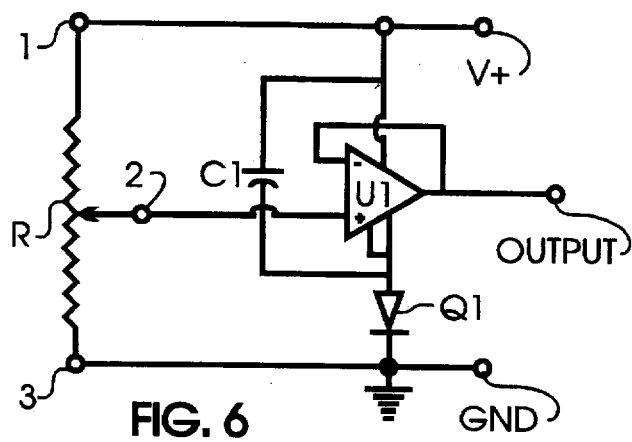
FIG. 6 illustrates the preferred embodiment of the present invention schematically.

Referring to the schematic diagram of the preferred embodiment illustrated in FIG. 6, R designates the potentiometer, having three terminals numbered one to three. Terminal 2 designates a mechanically variable sliding contactor terminal, although for practical purposes, this invention applies to other types of potentiometers that may not use sliding type contactors. An external source provides the circuit with power via the terminals designated B+ and Gnd. Additionally illustrated is an operational amplifier U1, which, in the preferred embodiment, is selected for input and output voltages that will extend as close to or beyond, if possible, supply voltage. A variety of operational amplifiers or other voltage follower circuits might be satisfactory for this application depending upon the ultimate requirements for the unit. While a reversing of polarity would not normally be detrimental to potentiometer R, such accidental connection would likely destroy U1. In the preferred embodiment, diode Q1 provides protection against accidental reverse polarity connection. Q1, in the preferred embodiment, is selected for low forward voltage drop. Capacitor C1 provides a certain degree of isolation from noise transmitted to the B+ and Gnd terminals.

The characteristics of an ideal operational amplifier voltage follower are: infinite input impedance; zero output impedance; and precise equality between input and output voltages. While operational amplifiers may not exactly meet the ideal conditions, they come very close. For a typical operational amplifier, input impedance will be greater than 1 megohm, output impedance will be less than eight ohms, and output voltage will typically be within a few microvolts of input voltage. While these values are typical, one of ordinary skill in the art will recognize that there are various types of amplifiers with "better" performance and that cost and design requirements also affect component selection. For example, even greater values of input impedance are obtainable with some types of op-amps, particularly CMOS or JFET input types.

Figure 1:
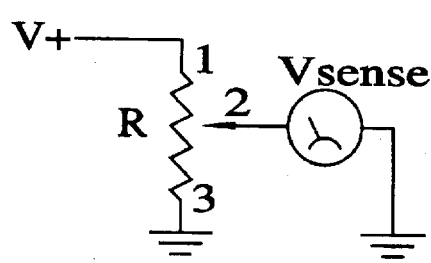
FIG. 1 illustrates a prior art position sensor schematically.
Figure 4:
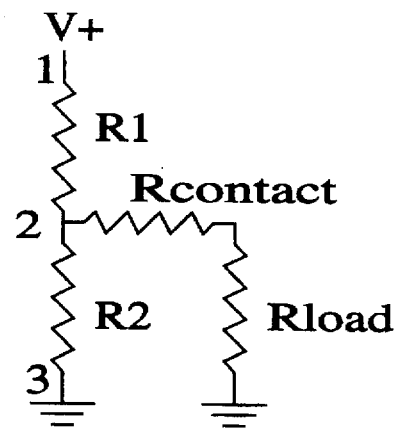
FIG. 4 illustrates the prior art position sensor of FIG. 1 by an equivalent circuit which includes both load resistance and contact resistance.
Figure 2:
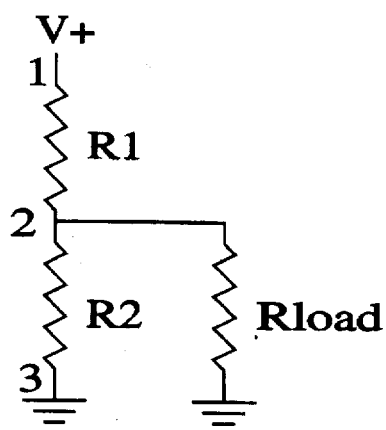
FIG. 2 illustrates the prior art position sensor of FIG. 1 by an equivalent circuit which includes load resistance.

When the electrical characteristics of the operational amplifier are combined with the potentiometer, the effect of sag and contact resistance is understandably negligible. For example, in order to effect a one percent change in the output voltage Vsense via contact resistance, using the op-amp of the preferred embodiment having an input resistance of one megohm, the contact resistance must be at least 10,000 ohms. In order to cause sag, Rload is now paralleled by an effective R of only 8 ohms. Therefore, again to produce a one percent deviation in the plot, Rload must be only 800 ohms. Clearly, the use of a 10,000 ohm contact resistance and an 800 ohm load resistance in the prior art circuit of FIG. 4 would produce an enormous deviation from linear. Not including sag, the sensed output voltage for the prior art design under those conditions would be less than 10 percent of desired, or linear voltage.

In the prior art, to minimize deleterious effects, R is reduced to a low resistance since this reduces the potential effect of sag. However, to lower R either the voltage V+ must be reduced or the potentiometer must be made to be more robust, since with a lower resistance and same voltage, more power will be dissipated by the potentiometer. The ill economic effects of making the potentiometer more robust are obvious. However, lowering V+ may not be a practical alternative. Depending upon the application, the voltage source may be supplied over long interconnecting leads. These leads act like antennas and pick up large amounts of electromagnetic interference (EMI) or radio frequency interference (RFI). As the supply voltage is reduced, the relative strength of the EMI/RFI is increased. EMI/RFI is noise in this application, and the signal to noise ratio (S/N) therefore worsens by lowering V+.

Another measure to improve the performance of the prior art device is to increase Rload to a resistance value as great as may be practicable. This both reduces sag and reduces the effect of a noisy contactor. However, this is generally done at some remote location from the position sensor. As the resistance of Rload is increased, again the sensitivity to EMI/RFI is increased, deleteriously affecting the signal to noise ratio. The present invention overcomes this disadvantage by locating Rload very near R, as FIGS. 7 to 9 illustrate.

Figure 7:
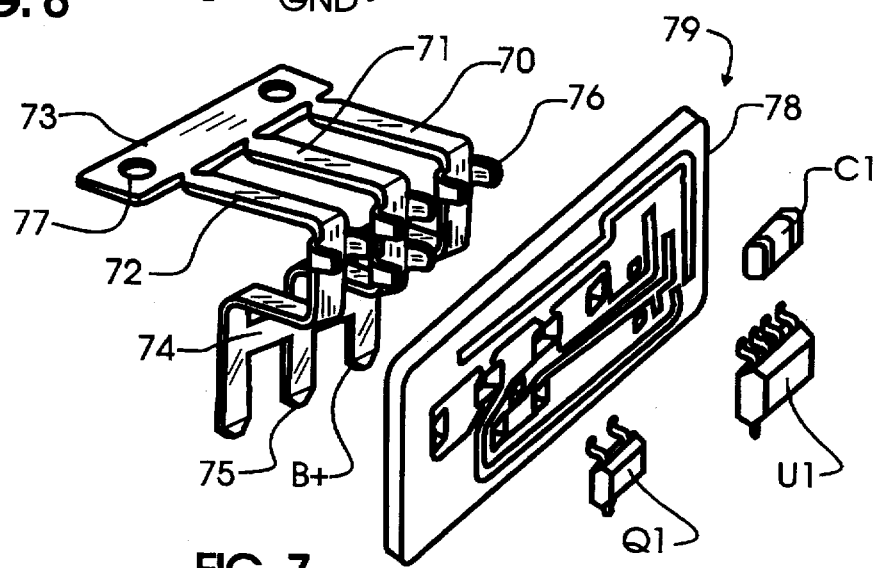
FIG. 7 illustrates the physical interconnection of the electronic circuitry to the electrical connector in the preferred embodiment of the present invention.

FIG. 7 illustrates the physical interconnection of the electronic circuitry to the electrical connector in the preferred embodiment of the present invention. Forming an electrical connector in a known manner from standard leadframe stock achieves the interconnection. The leadframe stock may typically have a frame 73 having therein sprocket or guide holes 77 that provide a way to feed the leadframe and to maintain positional registration during manufacturing operations. Formed from the original leadframe stock material are four terminals. Terminal 70 forms the electrical connection between the external source for B+ and the potentiometer and also provides power to printed circuit board 78 via tabs 76. Two tabs 76 are present on each terminal (70, 71, 72, and 75). These tabs are inserted into corresponding holes in printed circuit board 78 and may then be crimped. After electronic component placement, the entire assembly 79 may then be soldered by an appropriate method, such as wave or vapor phase reflow soldering. Continuing with the terminal structure, terminal 71 provides electrical connection between the potentiometer contactor and U1. Terminal 72 electrically interconnects the external source for ground to both the printed circuit board 78 and the potentiometer R. Terminal 75 serves to connect the output from U1 to the external sensing load. Once the assembly 79 is completely assembled and electrically attached (via soldering or other suitable method), leadframe supports 74 may be removed. These supports, which would otherwise short-circuit the assembly, are provided strictly for mechanical strength during manufacturing processes and are removed by methods well established in the lead frame art.

Figure 8:
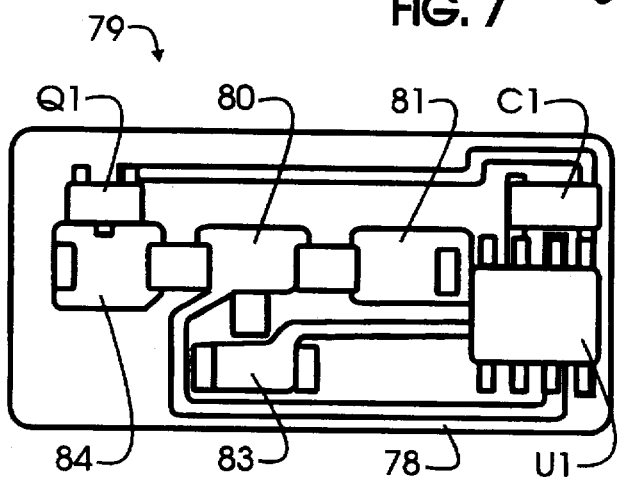
FIG. 8 is a view of the printed circuit board carrying the electronic circuitry of the preferred embodiment.

FIG. 8 provides details of printed circuit board 78, wherein the leadframe terminals have not been attached but the electronic components have been placed. From the figure, interconnection pad 80, which serves as the connection site for terminal 71 is illustrated. Interconnection pad 81 provides the connection site for terminal 70, and similarly interconnection pads 83 and 84 provide connection sites for terminals 75 and 72 respectively. Although diode Q1 has three terminals visible in both FIGS. 7 and 8, Q1 is a diode and uses only two of the three terminations.

Figure 9:
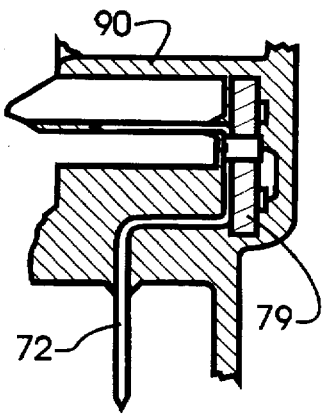
FIG. 9 is a cross-section view of an assembled electronic circuit packaged with a position sensor, assembled in accord with the preferred embodiment of the present invention.

After completion, assembly 79 is encapsulated in the insert molding process of housing 90, illustrated in FIG. 9, just as a standard set of terminals would be. Should molding parameters warrant, assembly 79 may be provided with a partial or complete covercoat or encapsulant as required. The selection of an appropriate covercoat or encapsulant is recognized as being within the level of ordinary skill for one familiar with the molding art.

As can be seen from the illustration in FIG. 9, the completed position sensor is produced in a package and in every way from an exterior view resembles a position sensor without electronic circuitry. This fact is most desirable since the new device may be used as a direct replacement for the prior art device in most applications without requiring customer redesign or retooling, while still providing all the benefits aforementioned of the electronic circuit. Additionally, since the circuit is within the connector portion of the position sensor housing, the circuitry may be used with a great variety of potentiometer physical designs without interfering in any way with already refined potentiometer performance.

While incorporation of the electronic circuit directly into the potentiometer housing minimizes lead lengths and reduces coupling of noise into the circuit thereby enhancing resistance to EMI/RFI, there may be additional cases which warrant further noise protection. This may be accomplished using one of a variety of well-known shielding techniques that affect only the exterior package of the position sensor. U.S. Pat. Nos. 4,795,660, 4,774,270, 4,678,260 and 4,519,664, for exemplary purposes, illustrate such methods. The preferred embodiment synergistically accomplishes this because of the packaging arrangement that includes both a potentiometer and an electronic circuit, and the low output resistance of the electronic circuit which reduces the signal to noise ratio of the output signal when monitored at some external location.

Figure 10:
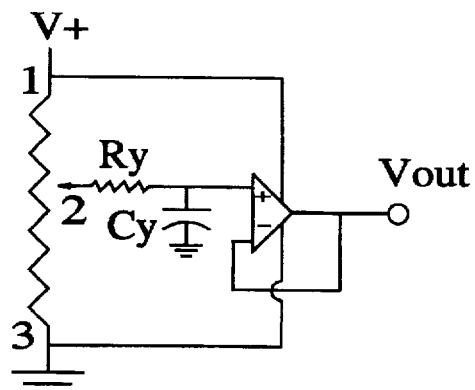
FIG. 10 schematically illustrates an alternative embodiment of the invention.

FIG. 10 schematically illustrates an alternative embodiment of the circuitry which could desirably be incorporated into a potentiometer package. The circuit is similar to FIG. 6, and like parts will not be repeated herein. Particularly advantageous in this schematic is the inclusion of a low pass filter. $R_y$ and $C_y$ comprise a low pass filter, and $R_y$ might be an unnecessary component depending upon the equivalent resistance of divided resistor R. $C_y$ may be a discrete capacitor or may be comprised by capacitance from a neighboring ground or V+ trace.

Figure 5:
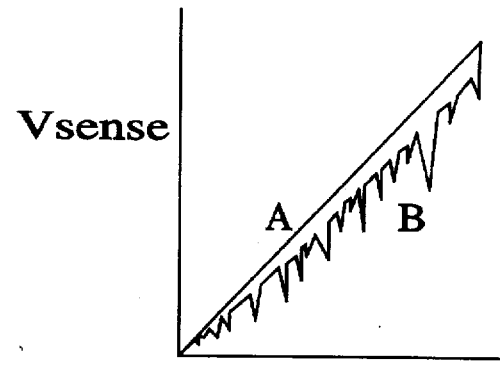
FIG. 5 illustrates two typical plots of sensed voltage versus contactor position for a "quiet contactor" and a "noisy contactor."
Figure 3:
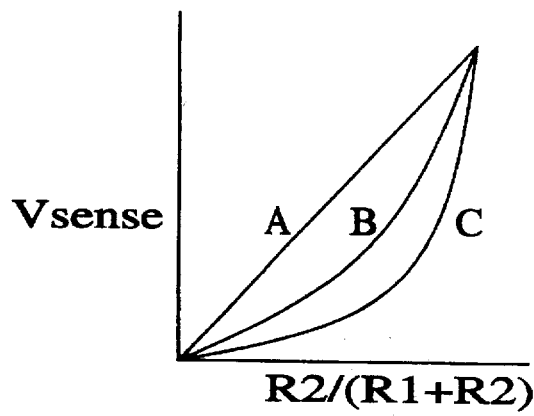
FIG. 3 illustrates some typical plots of sensed voltage versus contactor position for various values of load resistance.

The incorporation of a filter circuit offers several potential advantages. First, dynamic changes in contact resistance such as shown by plot B in FIG. 5 will have reduced significance (although the filter will not affect static changes in contact resistance). Second, output from the potentiometer used in high vibration applications such as moving machinery will not be as corrupted by the vibration. Third, high frequency EMI/RFI picked up within the body of the potentiometer or through the supply and ground connections will be attenuated and so will have even a more reduced affect on the circuitry.

While the foregoing details what is felt to be the preferred embodiment of the invention, no material limitations to the scope of the claimed invention is intended. Further, features and design alternatives that would be obvious to one of ordinary skill in the art are considered to be incorporated herein. For example, while the preferred embodiment illustrates the use of a particular voltage follower circuit and an alternative embodiment, there are many other voltage follower, amplifier and other circuits, op-amp, transistor and otherwise, which could be adopted within the scope of the invention. For example, FIG. 10 introduces a single low pass filter. However, the use of a compound filter or other variations of low pass filters as known in the filtering art would be within the realm of one of ordinary skill in light of the present disclosure, and so is considered to be incorporated herein. The scope of the invention is set forth and particularly described in the claims hereinbelow.

We claim:

1. An improved position sensor for reliably sensing a position when operated in a harsh environment having a sealed housing, a first resistive element, a movable contactor tap located in said sealed housing for protection from potentially harmful environmental conditions providing a voltage obtained from said first resistive element representative of a position of said contactor tap relative to said first resistive element, and a voltage follower amplifier, said voltage follower amplifier and said first resistive element located in said sealed housing.

2. A highly reliable sensor for generating an output electrical signal representative of a condition comprising:

sensing means for producing a first electrical signal representative of a first measured condition, said sensing means comprising a resistive element having two discrete terminations, an electrical contactor means for contacting said resistive element at a first position generally between said two discrete terminations, said electrical contactor means and said resistive element being relatively movable to vary said first position of contact relative to said two discrete terminations and to thereby vary said first electrical signal;

an electrical circuit having a high impedance input and a low impedance output and receiving as an input signal said first electrical signal and generating as an output signal a second electrical signal, said second electrical signal having a voltage which follows a voltage of said first electrical signal; and enveloping means for enveloping said electrical circuit and said sensing means, said electrical circuit and said sensing means being proximal within said enveloping means, said electrical contacting means being protected from potentially harmful environmental conditions, said enveloping means only enveloping said sensing means and said electrical circuit.

3. The sensor of claim 2 wherein said first measured condition comprises a first measured position.

4. The sensor of claim 2 further comprising a lubricant means for reducing friction between said electrical contactor and said resistive element.

5. The sensor of claim 2 wherein said enveloping means is formed by molding, and wherein said electrical circuit means is molded within said enveloping means.

6. The sensor of claim 2 further comprising electrically conductive terminations which extend from a region substantially surrounded by said enveloping means to said external environment.

7. The sensor of claim 6 wherein said electrical circuit means is electrically and physically coupled directly to said electrical terminations.

8. The sensor of claim 7 wherein said electrical terminations are formed from a lead frame and dimensioned to accommodate said electrical circuit means.

9. A device for noise peak suppression during a potentiometer evaluation, comprising:

a potentiometer located between a reference voltage and mass and formed as one of a throttle flap potentiometer and an air quantity measuring potentiometer, said potentiometer having a slider with a slider output delivering a slider current which by dimensioning of the device is such that it is smaller than one microampere;

a control device adapted to receive a signal from said slider output of said potentiometer;

an amplifying unit located between said potentiometer and said control device so that a signal picked up from said slider output is amplified in said amplifying unit before being supplied to said control device; and a potentiometer chamber which only surrounds said potentiometer and said amplifying unit, for protecting said potentiometer slider from potentially harmful enviromnental conditions.

10. A device for noise peak suppression during a potentiometer evaluation, comprising:

a potentiometer located between a reference voltage and mass and formed as one of a throttle flap potentiometer, said potentiometer having a slider with a slider output delivering a slider current which by dimensioning of the device is a low level current;

a control device adapted to receive a signal from said slider output of said potentiometer;

an amplifying unit located between said potentiometer add said control device so that a signal picked up from said slider output is amplified in said amplifying unit before being supplied to said control device; and a potentiometer chamber which only surrounds said potentiometer and said amplifying unit, for protecting said potentiometer slider from potentially harmful environmental conditions.

11. A device as defined in claim 10, further comprising a potentiometer chamber which surrounds said potentiometer.

12. A device as defined in claim 11, wherein said amplifying unit is located inside said potentiometer chamber.

13. The improved position sensor of claim 1 wherein said voltage follower amplifier and said first resistive element are environmentally isolated from each other.

14. The improved position sensor of claim 13 wherein a wall is formed to environmentally isolate said voltage follower from said first resistive element.

* * * * *